United States Patent [19]
Arroyo

[11] Patent Number: 5,215,938
[45] Date of Patent: Jun. 1, 1993

[54] PROCESS TO OBTAIN SEMI-INSULATING SINGLE CRYSTALLINE EPITAXIAL LAYERS OF ARSENIDES AND PHOSPHIDES OF METALS OF THE GROUP III OF THE PERIODIC TABLE USEFUL TO MAKE ELECTRONIC DEVICES

[75] Inventor: Jaime M. Arroyo, Col. Torres Lindavista, Mexico

[73] Assignee: Centro de Investigacion y de Estudios Avanzados del I.P.N., Mexico City, Mexico

[21] Appl. No.: 567,470

[22] Filed: Aug. 15, 1990

[51] Int. Cl.$^5$ ............................................. H01L 21/205
[52] U.S. Cl. .................................... 437/104; 437/107
[58] Field of Search ............... 437/104, 107, 173, 174; 148/DIG. 23, DIG. 65, DIG. 46, DIG. 113, DIG. 148, DIG. 169

[56] References Cited

PUBLICATIONS

Native Defects in Gallium Arsenide, J. C. Bourgoin et al., J. Appl. Phys. 64(9), pp. 65-91 Jan. 1, 1988.
Epitaxial GaAs by Hose Spece Vapor Transport, F. Chavez et al., J. Appl. Phys. 54(11), pp. 6646-6651 Nov. 1983.
Compensation Mechanism in Semi-insulating GaAs: The Role of Intrinsic Acceptor Defects; H. J. von Bardeleben et al., Appl. Phys. Lett. 53 (12), pp. 1089-1091 Sep. 19, 1988.
Effects of the Growth Conditions on the Incorporation of Deep Levels in Vapor-Grown GaAs; M. Ozeki et al., J. Appl. Phys. 50(7), pp. 4808-4813.
Transient Capacitance Spectroscopy in Heavily Compensated Semi-conductors, D. Stievenard et al., Solid State Electronics, vol. 28, No. 5, pp. 485-492, 1985.
Influence of the Growth Conditions on the Incorporation of Deep Levels in VPE GaAs, D. Bois, J. of Appl. Phys., vol. 47(9), pp. 4137-4144.
Photoluminescence and Electrical Properties of Epitaxial GaAS Grown by Close Space Vapor Transport; J. Mimila Arroyo et al., Mat. Res. Soc. Symp. Proc. vol. 56 1986 Materials Research Society.
Vapor Phase Transport and Epitaxial Growth of $GaAs_{1-x}P_x$ Using Water Vapor, G. E. Gottlieb, J. of the Electrochemical Society, vol. 112, No. 2, pp. 192-196.
Photoluminescence and Electrical Properties of Close Space Vapor Transport GaAs Expitaxial Layers, J. Mimila-Arroyo et al., J. Appl. Phys. 58(9), pp. 3652-3654, Nov. 1, 1985.
High Quality GaAs Epitaxial Layers, Grown by Csvt. F. Chavez et al., Mats. Res. Soc. Symp. Proc. vol. 37 1985 Materials Research Society.
Gallium Arsenide Field-Effect Transistor by Close Spaced Vapor Transport Epitaxy, J. Mimila-Arroyo et al., Appl. Phys. Lett. 51(24), pp. 2004-2006 Dec. 14, 1987.
Oxygen in Gallium Arsenide, J. C. Bourgoin et al., Aug. 1990.

Primary Examiner—George Fourson
Attorney, Agent, or Firm—Finnegan, Henderson, Farabow, Garrett & Dunner

[57] ABSTRACT

The present invention is related to a process to obtain semi-insulating single crystalline epitaxial layers of arsenides and phosphides of metals from group III of the periodic table, mainly Gallium Arsenide (GaAs) and Indium Phosphide (InP) useful for making electronic devices. The semi-insulating layers can be grown through the use of any vapor phase epitaxial growth technique, even if residual impurities are present in the material normally grown with any of these techniques. The semi-insulating nature is achieved without intentionally adding compensating impurities. The process is characterized by its control of the electric conductivity of the single crystalline epitaxial layer of such semiconducting compounds through the growth rate and the temperature of the crystal during the growth. The semi-insulating layers are useful to make field effect transistors, integrated circuits, diodes and other electronic devices.

3 Claims, 3 Drawing Sheets

PROCESS TO OBTAIN SEMI-INSULATING SINGLE CRYSTALLINE EPITAXIAL LAYERS OF ARSENIDES AND PHOSPHIDES OF METALS OF THE GROUP III OF THE PERIODIC TABLE USEFUL TO MAKE ELECTRONIC DEVICES

The present invention is related to a process to obtain semi-insulating single crystalline epitaxial layers of arsenides and phosphides of metals from group III of the periodic table, mainly Gallium Arsenide (GaAs) and Indium Phosphide (InP) useful for making electronic devices. The semi-insulating layers can be grown through the use of any vapor phase epitaxial growth technique, even if residual impurities are present in the material normally grown with any of these techniques. The semi-insulating nature is achieved without intentionally adding compensating impurities. The process is characterized by its control of the electric conductivity of the single crystalline epitaxial layer of such semiconducting compounds through the growth rate and the temperature of the crystal during the growth. The semi-insulating layers are useful to make field effect transistors, integrated circuits, diodes and other electronic devices.

BACKGROUND OF THE INVENTION

In previous experiments, it has been possible to make integrated circuits and other electronic devices based on GaAs and InP. Such devices are made on single crystalline semiconductors where electric current does not flow, also is known as semi-insulators. Electric conductivity at room temperature in these materials is due to free charge carriers which are introduced by impurities, that is, atoms of some chemical elements other than those constituting the matrix of the semiconductor. For example, in regard to GaAs, impurities are atoms of chemical elements which are neither Ga nor As. The materials by their electronic structure and location in the crystal, introduce free charge carriers at room temperatures as electrons or holes. In the case of GaAs and InP bulk single crystalline materials, in spite of the care taken during the preparation and growth to avoid incorporation of impurities, they have a high concentration of impurities which make these crystals conductive. Nevertheless, since the manufacture of integrated circuits and some electronic devices are based on semi-insulating single crystalline substrates for the physical and chemical processes needed in their manufacture, procedures have been developed to make these semi-insulating crystals. The processes most often used for this purpose are: i) controlled incorporation of impurities, which introduces energy levels close to the middle of the energy forbidden band gap of the semiconductor of interest. When such impurities are added in the proper quantity and type, they compensate for the impurities which give the free charge carriers by reducing the electrical conductivity of the crystal. An example of this process is the addition of chromium (Cr) to Gallium arsenide and Fe to Indium phosphide. ii) The second possibility, which is commonly used in GaAs, consists of growing the crystal with a low acceptor impurity concentration from a melt lightly out of stoichiometry. For example, an impurity which is arsenic rich, under conditions such that the deep donor level, EL2, is formed in the crystal in concentrations higher than those of the shallow acceptors. By such a process the Fermi level is pinned around the middle of the energy band gap and the crystal becomes semi-insulating. In spite of the effort developed in this direction, the use of crystals obtained by this technology is strongly limited because of their poor quality since they usually have a high density of crystalographic defects, dislocation networks, undesired residual impurities and above all these defects are distributed highly nonhomogeneously in the bulk of the crystal. The effects of such imperfections and their nonhomogeneous distribution through the crystal on the properties of the integrated circuits and other electronic devices made on them, are all negative. Among the most frequent undesired effects are: fluctuations in the threshold voltage of field effect transistor from point to point on the wafer and even on a single integrated circuit, reduction of the power gain, increase of the electric noise on the transistors and, the worst of all, the drastic reduction of the production yield limiting the development of this material.

An attempted solution to this problem consists of growing on the above described crystal an epitaxial buffer layer having fewer defects than the substrate. This can be done using any of the well know epitaxial techniques, such as: Liquid Phase Epitaxy, Chemical Vapor Deposition; OM-CVD, molecular beam epitaxy (MBE) or any mixed technique. Layers obtained by any of these techniques are very homogeneous in their physical properties, have good surface morphology such as a mirror smooth surface to make the photolithographic processes necessary to the manufacture of integrated circuits and other electronic devices.

The high resistivity or semi-insulating behavior in these layers is achieved using one of the two options described below: a) adding in a controlled way impurities which reduce the free charge carriers concentration exactly as in case (i) describe before for the bulk materials, and b) growing very high purity epilayers having high resistivity, although usually lower than the one obtained by process (a). The first option needs reactants which will provide the impurity which introduces the middle gap level, while the second option involves a complicated process to get a very high purity material which is difficult to conclude successfully. Finally the option of growing epilayers slightly out of stoichiometry in order to introduce compensating defects which reduce the free charge carriers concentration, as it has been described before for bulk material, has not been achieved until now.

In our Mexican patent application No. 13192 entitled "PROCESS TO PREPARE GaAs EPITAXIAL LAYERS BY CLOSE SPACE VAPOR TRANSPORT," a process is characterized by placing the substrate material and source material very close and facing each other. The space between the substrate material and the source material is filled by a gas mixture, such as a transporting gas and $H_2$. The substrate material and source material are heated simultaneously but at different temperatures from each other. The transporting gas reacts with both source and substrate materials, but because of the higher temperature of the source material, it produces a higher partial pressure of the products of the reaction than the partial pressure on the surface of the substrate. This difference in pressure gives rise to a gas diffusion of the products of the reaction from the source toward the substrate surface, which raises the pressure on the substrate surface above its equilibrium pressure. The higher pressure causes reverting the sense of this reaction and recovering the initial semiconductor but deposited on the substrate.

However, although the results obtained on GaAs epitaxialy grown with this technique were very interesting, other important parameters such as the growth rate effect on layer properties have not yet been studied.

An object of this invention is a process to grow semi-insulating epitaxial layers of the semiconductor materials of arsenides and phosphides without intentionally adding impurities to compensate the free charge carriers.

This invention relates to the fact that through the proper choice of temperature and growth rate of crystalline layers using any vapor phase epitaxy technique, it is possible to grow semi-insulating single crystalline layers of the semiconductor materials hereby mentioned in spite of the presence of residual impurities and without intentionally adding impurities to compensate for them. In any vapor phase technique, the growth rate needed to obtain a semi-insulating layer is a function of the growth temperature and the purity of the material usually grown with it. In our case, the semi-insulating nature of the epilayers grown is due to the presence of the same atoms which constitutes the crystal. For instance, Ga and As for the case of GaAs, but placed in such a way that they compensate the free charge carrier making the grown material semi-insulating.

The process is characterized by the following steps:

1) Preparation of a substrate for growing epitaxial layers of arsenides and phosphides of metals of the group III of the periodic table, free of any kind of contamination, organic or inorganic.

2) Introduction of the prepared substrate into the vapor phase reactor growth chamber, preferentially of the Close Space Vapor Transport (CSVT) type or any other of the vapor phase type.

3) Preparation of the growth chamber as a function of the type of reactor being used, for example molecular beam epitaxy, chemical vapor deposition using halogens, hydrides or metal-organic reactants, but preferentially of the CSVT type.

4) Growth of the epilayer using preferentially a CSVT type reactor, by heating simultaneously the source material, an arsenide or phosphide of metals of the group III of the periodic table, and the substrate materials at fixed but different temperatures between 450° and 1150° C.

It is therefore, an object of this invention to provide a process to grow semi-insulating single crystalline epitaxial layers which allows production of semi-insulating layers at high growth rates, which are useful for making electronic devices.

It is another object of this invention to provide a process to grow semiconductor epitaxial layers controlling the deep levels concentration in them.

It is still a further object of this invention to provide a process to grow semi-insulating epitaxial layers that does not need the use of toxic products or that gives off toxic byproducts.

It is a further object of this invention to provide a process to grown on ordinary single crystalline substrates semiconductor semi-insulating buffer epitaxial layers to be used for making integrated circuits and other electronic devices.

DISCLOSURE OF THE INVENTION

Semi-insulating GaAs and InP substrates used to make integrated circuits are grown by the so called Czochralski technique. This crystals have a nonhomogeneous distribution of their physical properties caused by a nonhomogeneous distribution of impurities such as shallow donors and acceptors, deep levels and crystalographic defects Bourgoin, J. C., *J. Appl. Phys.* 64 R65, (1988). The semi-insulating behavior in GaAs is a result of the electrical compensation between donors, acceptors, a deep level known as EL2 and an intrinsic acceptor. Von Bardeleben, H. J., et al., *Appl. Phys. Let.* 53, 1089 (1988). An attempt to solve this problem consists of growing GaAs epitaxial layers on these substrates. Nevertheless, when epitaxial layers are non-intentionally compensated they are not really semi-insulating. High resistivity layers can be grown by low temperature molecular beam epitaxy, but in this case a high defect concentration compensates the free charge carriers, however, these layer properties are not stable at the temperatures involved in integrated circuits manufacture.

In another process, Osiky (1979) and Humbert (1976), showed that the concentration of the deep level known as EL2 in GaAs grown by vapor phase epitaxy increases with the growth rate of the epitaxial layer V. Osiki M., et al., *J. Appl. Phys.* 50, 4808 (1979) and Humbert, A., et al., *J. Appl. Phys.* 47, 4137 (1976). Nt increases typically from $10^{13}$ to $10^{14}$ cm$^{-3}$, when V varies from 5 to 30 microns/hour for a growth temperature of 770° C. Nevertheless, these inventors do not succeed in reaching an EL2 concentration high enough to get semi-insulating epitaxial layers.

In the present invention it has been found that through the use of growth rates for the epitaxial layers V, higher than the currently common growth rates, it is possible to introduce in the GaAs growing layer a deep level concentration Nt higher than $10^{16}$ cm$^{-3}$. This value is sufficient to compensate the residual free charge carriers as is done in bulk crystalline semi-insulating material. In our Mexican patent application No. 13192, there is a disclosure of improvements in the close space vapor transport technique which allow to reach very high growth rates in the range of microns per minute. First used in GaAs by Gottlieb (1963), this technique has been widely improved. Gottlieb, G. E., *J. Electrochem. Soc.* 112, 192 (1965). The epitaxial layers produced by this technique have been deeply studied by photoluminescence, deep level transient spectroscopy, secondary ions mass spectroscopy and other techniques. Mimila-Arroyo J., et al., *J. Appl. Phys.* 58, 3652 (1985) and Chavez F. et al., *Mat. Res. Soc. Symp.* 37, 135 (1985). Epitaxial layers grown with this improved technique show a residual electron concentration of n = $10^{16}$ cm$^{-3}$ and rather reasonable values of their mobility $\mu n \approx 5000$ cm$^2$/v.s at room temperature. These layers have even been used to make devices, but without using the semi-insulating epilayers object of this invention. Mimila-Arroyo J., et al., *Appl. Phys. Let.* 51, 2004 (1987).

The advantages of this invention will become apparent upon consideration of the following disclosure of this invention, especially when taken in conjunction with the following figures shown herein. All of these experimental results were obtained with a CSVT reactor.

DETAILED DESCRIPTION OF THE INVENTION

Figure 1:
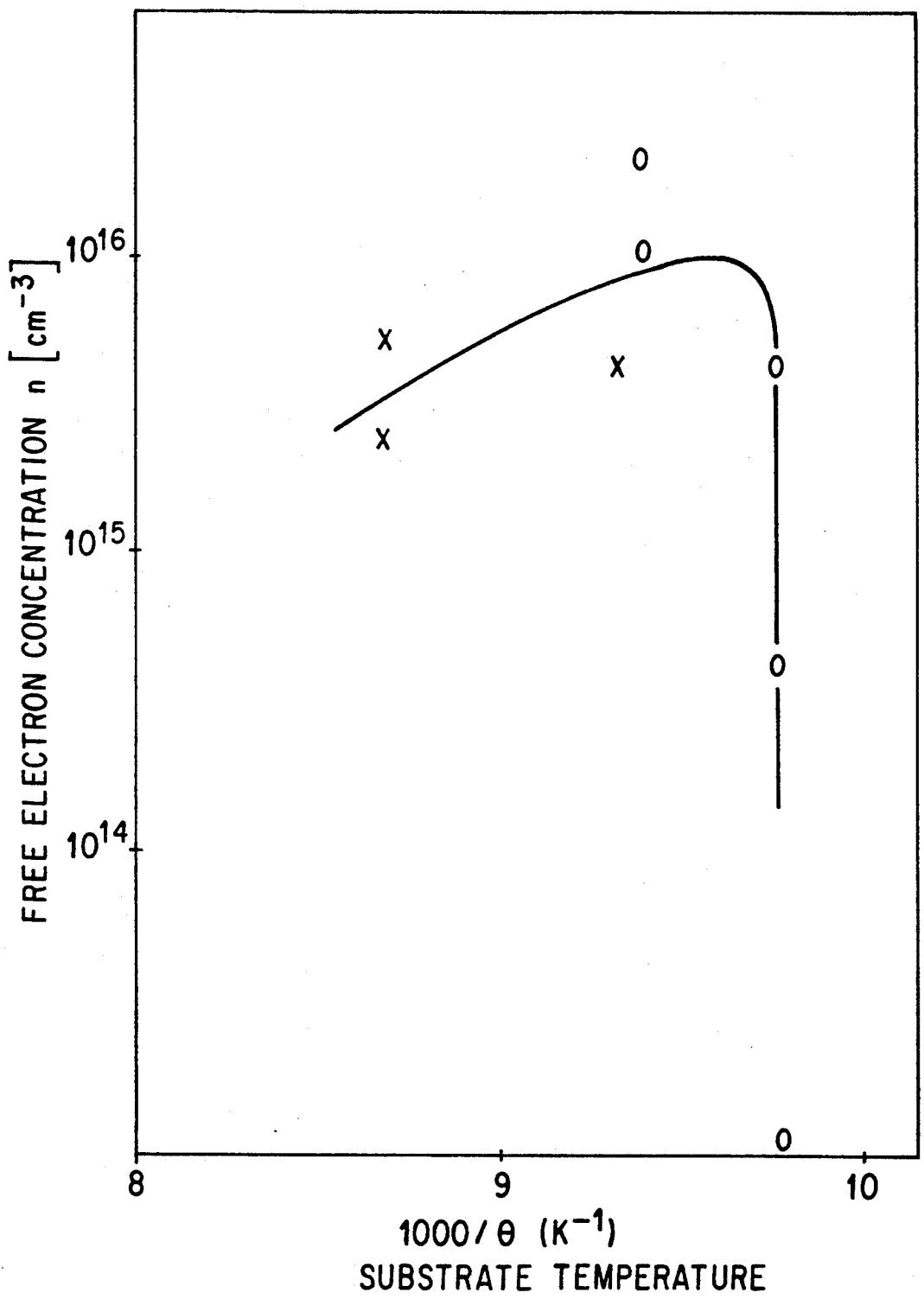
FIG. 1 shows a graphic representation of the variation on the free charge carriers concentration n in the epitaxial layer as function of the substrate temperature $\theta$ during the growth, for two sets of layers, each set corresponding to a source temperature T(x: 900° C., O: 850° C.).

In FIG. 1, it is shown the variation of free electrons concentration at room temperature, as function of the substrate temperature $\theta$ at which the layer was grown. These values were obtained by capacitance-voltage measurements on Schottky barriers on this layers. This is done for two groups of layers (x and o). Each group was grown using a different source temperature. For the group represented by x the source temperature was 900° C. and for that represented by o the source temperature was 850° C. It is seen that for a value of $\theta$ around 74° C. the electron concentration sharply drops from $10^{16}$ to $10^{19}$ cm$^{-3}$ or below, as this is the lower limit for electron concentration that can be measured with this technique.

Figure 2:
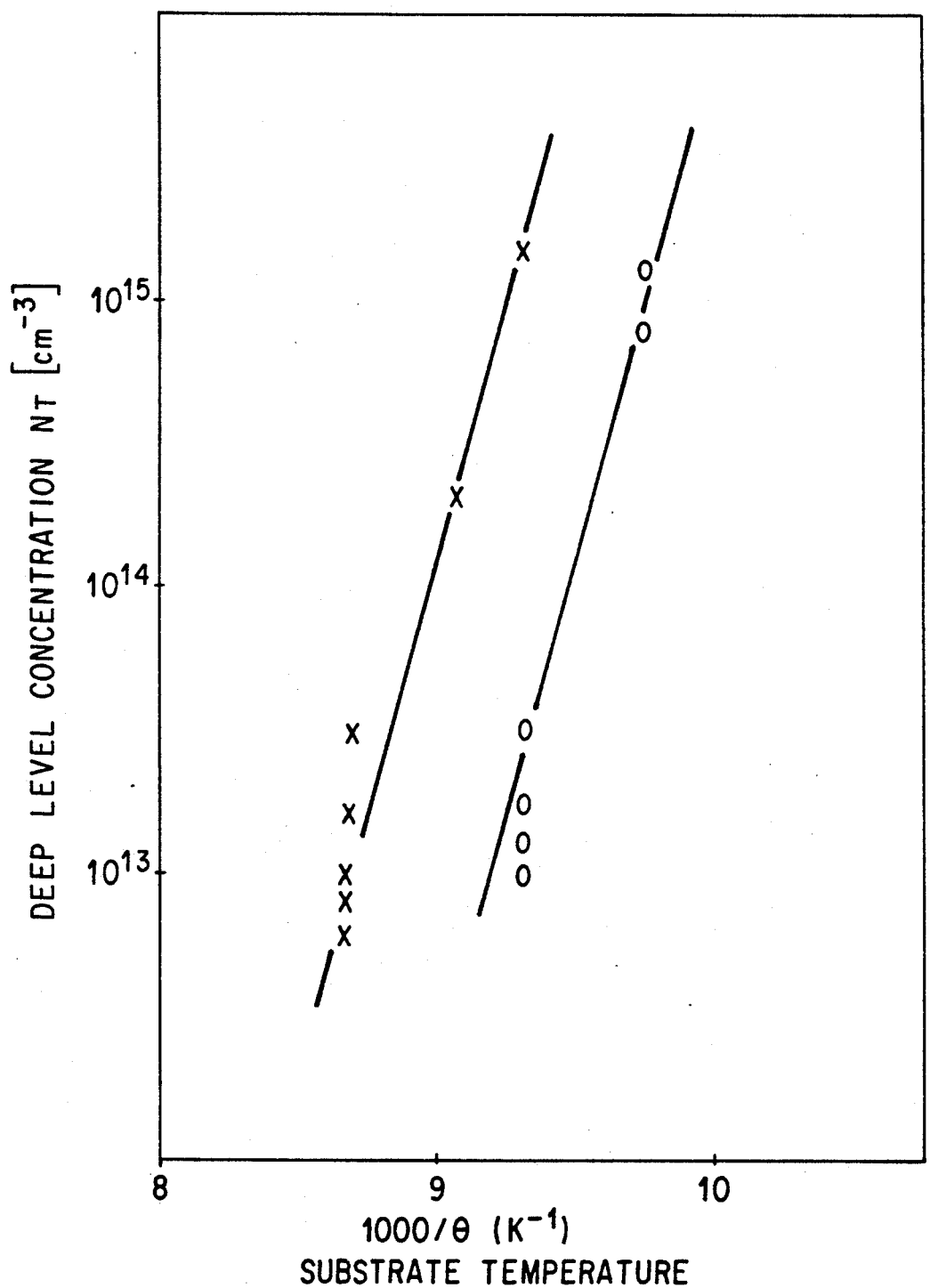
FIG. 2 shows a graphic representation of the deep levels concentration Nt as function of the substrate temperature $\theta$ during the growth, as in FIG. 1, for two set of layer each set corresponding to a source temperature T (x: 900° C., O=850° C.).
Figure 3:
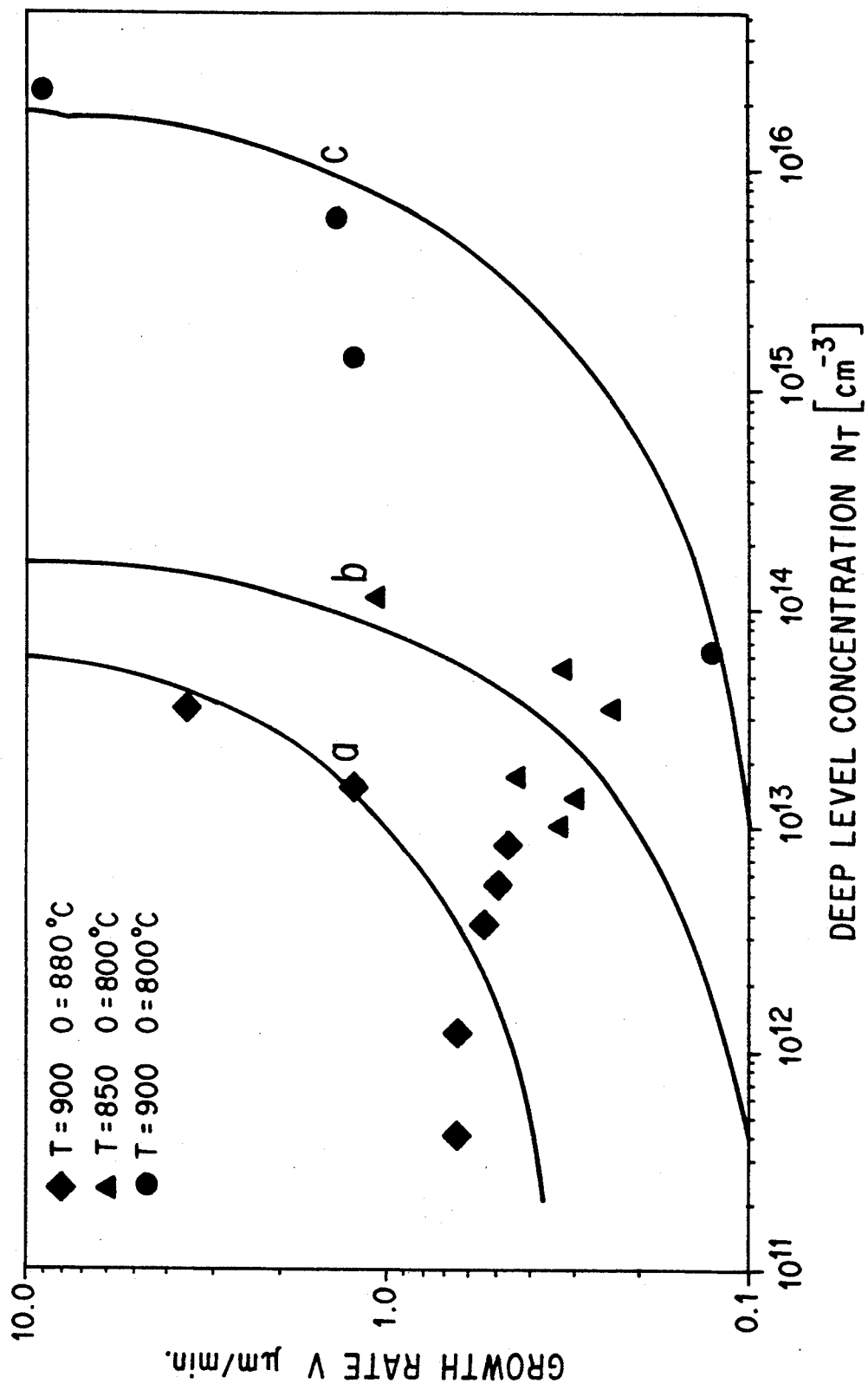
FIG. 3 shows a graphic representation of the variation of the deep level concentration as function of the growth rate for three sets of layers (curves; a, b and c), for each set the source and substrate temperatures T and $\theta$ respectively were kept constant and the growth rate V was varied through the variation of the partial pressure of the transporting gas (a: T=900° C., $\theta$=880° C.; b: T=850° C., $\theta$=800° C.; C: t=900° C., $\theta$=800° C.).

As the semi-insulating behavior of GaAs is due to the presence of deep levels, we monitored the introduction of this levels as a function of the source T and substrate $\theta$ temperatures and growth rate V during the growth of the epitaxial layer, using the deep level transient spectroscopy technique. The results are shown in FIGS. 2 and 3. FIG. 2 shows the deep level concentration Nt as function of the temperature $\theta$ at which the layer was grown, keeping the source temperature constant, it is seen that the deep level concentration increases as the substrate temperature decreases, reaching the concentration range of $10^{16}$ cm$^{-3}$ at the substrate temperature at which the electron concentration decreases sharply.

FIG. 3 shows the variation on the deep level concentration Nt in the grown layers as a function of the growth rate, when this is changed varying the $H_2O$ partial pressure in the growth atmosphere, keeping constants the source and substrate temperatures. From this FIG. 3, its seen that if two different layers are grown at the same source T and substrate $\theta$ temperature, but each one at different growth rate V changed through a change in $H_2O$ partial pressure, the layer grown at higher growth rate will have higher deep level concentration than the other (grown at lower growth rate), and that for growth rates higher than 3 or 5 microns per minute, the deep levels concentration does not changes significantly any more.

FIG. 3 shows obtained results for three sets of source (T) and substrate ($\theta$) temperatures; curve a: T=900° C., $\theta$=880° C., curve b: T=850, $\theta$=800 and curve c: T=900° C., $\theta$=800° C. Also, it can be seen that the behavior of the deep level concentration Nt in the grown layers for each pair of values for T and $\theta$ and as function of the growth rate is similar. At the same time it should be remarked that on curve c, the deep level concentration is higher than $10^{16}$ cm$^{-3}$ and is just this fact which allows to grow GaAs semi-insulating layers.

The following examples will further define the invention. The examples are given only as an illustration and they should not limit this invention to their scope.

EXAMPLE 1

An epitaxial GaAs layer is grown having a deep level concentration around $10^{15}$ cm$^{-3}$, using as source material polycrystalline undoped GaAs available from Sumitomo Corp. and as a substrate medium quality single crystalline GaAs from the same supplier. The materials are placed in the close space vapor transport growth chamber and a mixture of $H_2$ and $H_2O$ is introduced to the growing atmosphere at a pressure around the atmospheric value. The water vapor content is fixed to obtain a growth rate about 0.8 microns per minute. Then both materials are heated simultaneously, the source at 850° C. and the substrate at 750° C. The epitaxial layer grown by this way has a deep level concentration around $10^{15}$ cm$^{-3}$.

EXAMPLE 2

Following the procedure described in Example 1, but now using as source temperature 900° C. and as substrate temperature 800° C. and a growth rate of 100 nanometers/minute, the grown layer has a deep level concentration around $10^{13}$ cm$^{-3}$. FIG. 3, curve c). Once again using the same procedure and the same pair of temperatures, but a growth rate of 9 microns/minute, the grown layer has a deep level concentration around $10^{16}$ cm$^{-3}$.

EXAMPLE 3

Once again following the procedure described in Example 1 and fixing for the source temperature the value of 850° C. and for the substrate 700° C. and a growth rate of around 3 microns/min., the grown epitaxial layer is semi-insulating.

What is claimed is:

1. A process for growing semi-insulating epitaxial layers comprising:
   (a) providing a substrate material and a source material, wherein the source material is gallium arsenide, gallium phosphide or indium phosphide;
   (b) introducing the substrate material and the source material into a growth chamber;
   (c) introducing a mixture of hydrogen and water vapor into the growth chamber;
   (d) heating the source material and the substrate material wherein the temperature of the source material is between 450° and 1150° C., the temperature of the substrate material is between 450° and 1150° C. and the temperature gradient between the source material and the substrate material is between 100° and 250° C.; and
   (e) wherein the growth rate of epitaxial crystals is higher than 1.0 micron per minute, and thereby producing a semi-insulating epitaxial layer.

2. A process according to claim 1 wherein the growth chamber is a close spaced vapor transport type (CSVT) growth chamber.

3. A processing according to claim 1 wherein the water vapor concentration in the growth chamber is 1-1000 ppm in terms of volume mixed with hydrogen.

* * * * *